(12) United States Patent
Kawahara et al.

(10) Patent No.: US 11,346,879 B2
(45) Date of Patent: May 31, 2022

(54) SEMICONDUCTOR DEVICE

(71) Applicant: Mitsubishi Electric Corporation, Chiyoda-ku (JP)

(72) Inventors: Chihiro Kawahara, Chiyoda-ku (JP); Takeshi Horiguchi, Chiyoda-ku (JP); Yoshiko Tamada, Chiyoda-ku (JP); Yasushi Nakayama, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 413 days.

(21) Appl. No.: 16/499,661

(22) PCT Filed: Jan. 4, 2018

(86) PCT No.: PCT/JP2018/000012
§ 371 (c)(1),
(2) Date: Sep. 30, 2019

(87) PCT Pub. No.: WO2018/211735
PCT Pub. Date: Nov. 22, 2018

(65) Prior Publication Data
US 2020/0116780 A1    Apr. 16, 2020

(30) Foreign Application Priority Data

May 19, 2017    (JP) .............................. JP2017-099603

(51) Int. Cl.
*G01R 31/26*    (2020.01)
*G01R 31/28*    (2006.01)
(Continued)

(52) U.S. Cl.
CPC .......... *G01R 31/2621* (2013.01); *H01L 29/78* (2013.01); *H01L 2224/48472* (2013.01); *H01L 2224/49111* (2013.01)

(58) Field of Classification Search
CPC ......... G01R 31/26; G01R 31/28; H01L 29/16; H01L 29/20; H01L 29/41; H01L 29/78; H01L 23/28; H01L 23/52; H01L 23/62
See application file for complete search history.

(56) References Cited

U.S. PATENT DOCUMENTS

2002/0024135 A1    2/2002  Arai et al.
2007/0296040 A1*  12/2007  Tametani ................ H01L 22/34
                                                              257/355

FOREIGN PATENT DOCUMENTS

DE        10249712 B3      3/2004
DE    102006049211 A1     12/2007
(Continued)

OTHER PUBLICATIONS

Office Action dated Mar. 15, 2021, in corresponding German patent Application No. 11 2018 002 579.9, 14 pages.
(Continued)

*Primary Examiner* — Neel D Shah
(74) *Attorney, Agent, or Firm* — Xsensus LLP

(57) ABSTRACT

An increased accuracy in detecting deterioration of a semiconductor device can be achieved. A first metal pattern and a second metal pattern are connected to a controller. A bonding wire connects the first metal pattern and an emitter electrode. A linear conductor is connected between a first electrode pad and a second electrode pad. First bonding wires connect the first electrode pad and the second metal pattern. Second bonding wires connect the second electrode pad and the second metal pattern. The controller detects the deterioration of the semiconductor device when a potential difference between the first metal pattern and the second metal pattern is above a threshold.

10 Claims, 12 Drawing Sheets

(51) Int. Cl.
    *H01L 29/16*     (2006.01)
    *H01L 29/20*     (2006.01)
    *H01L 29/41*     (2006.01)
    *H01L 29/78*     (2006.01)
    *H01L 23/28*     (2006.01)
    *H01L 23/52*     (2006.01)
    *H01L 23/62*     (2006.01)

(56) References Cited

FOREIGN PATENT DOCUMENTS

| | | |
|---|---|---|
| JP | 2007-49870 A | 2/2007 |
| JP | 2010-93289 A | 4/2010 |
| WO | WO 2005/038918 A1 | 4/2005 |

OTHER PUBLICATIONS

International Search Report dated Mar. 6, 2018 in PCT/JP2018/000012 filed Jan. 4, 2018.

\* cited by examiner

1A

SEMICONDUCTOR DEVICE

TECHNICAL FIELD

The present invention relates to a semiconductor device having a deterioration detection function.

BACKGROUND ART

A semiconductor element (power module) in which a power semiconductor element is packaged is used as a switching element in a wide range of fields. The semiconductor device may be used as a primarily component of a power supply system or motor drive system in general purpose devices (such as home appliances, electric vehicles, trains, or elevators) or industrial apparatuses (such as servomotors), for example.

Some semiconductor devices have a deterioration detection function. Japanese Patent Laying-Open No. 2010-93289 (PTL 1) discloses a power semiconductor module which detects deterioration of multiple metal wires (bonding wires) by measuring a potential difference between a surface electrode of a semiconductor element and an electrode metal plate which is connected to the surface electrode by the bonding wires.

CITATION LIST

Patent Literature

PTL 1: Japanese Patent Laying-Open No. 2010-93289

SUMMARY OF INVENTION

Technical Problem

Many of semiconductor devices, in which a power semiconductor element is packaged, interconnect a semiconductor element by ultrasonic bonded (bonded) bonding wires. When the semiconductor device is used for switching operation, a large current flows through the semiconductor device upon energized, and heat is thus generated due to a resistive component within the current path and also due to combination of electrons and holes at a P-N junction. The heat generated within the semiconductor device increases the temperature within the semiconductor device. The semiconductor device has a large heat value when energized, and thus is often connected to a heat sink to be air cooled or liquid cooled. When the semiconductor device is shut off, the temperature decreases. In general, a coefficient of thermal expansion is different between the semiconductor element and a component which includes metal interconnect and a solder, etc., and thermal stress can occur due to such changes in temperature. Changes in temperature, due to generation of heat and cooling, are significant particularly near the semiconductor element, and thus a stress is applied to and a crack is likely to occur at the joint between a bonding wire and the semiconductor element. As a crack is developed at the bonding wire, the bonding wire is easily come off or disconnected. The semiconductor device may fail due to such deterioration of the bonding wire. For this reason, there is a need to detect the deterioration of the bonding wire with high accuracy, in order to determine the life of the semiconductor device.

As the bonding wire connecting the surface electrode of the semiconductor element and an electrode metal plate is deteriorated, the resistance between the surface electrode of the semiconductor element and the electrode metal plate changes. The power semiconductor module disclosed in Japanese Patent Laying-Open No. 2010-93289 (PTL 1) detects deterioration of a bonding wire by detecting the changes in the resistance as changes in the potential difference between the surface electrode of the semiconductor element and the electrode metal plate.

If the surface electrode of the semiconductor element is formed from a single electrode pad, as the power semiconductor module disclosed in Japanese Patent Laying-Open No. 2010-93289 (PTL 1), the resistance (sheet resistance) of the electrode pad may be negligibly small, as compared to a combined resistance of multiple bonding wires. In such a case, changes in resolution between the surface electrode of the semiconductor element and the electrode metal plate is substantially equal to the changes in the combined resistance of multiple bonding wires.

Changes in the combined resistance of multiple bonding wires are primarily used to detect the deterioration of the semiconductor device, as Japanese Patent Laying-Open No. 2010-93289 (PTL 1), it may be difficult to detect the changes in the combined resistance of bonding wires if the changes are small.

The present invention is made to solve the problem as described above, and an object of the present invention is to increase the accuracy in detecting the deterioration of the semiconductor device.

Solution to Problem

A semiconductor device according to the present invention includes a first electrode and a second electrode, a control electrode, a controller, a first metal pattern and a second metal pattern, a connector, and a plurality of bonding wires. The controller applies a voltage to the control electrode to control current flow from the first electrode to the second electrode. The first metal pattern and the second metal pattern are connected to the controller. The connector connects the first metal pattern and the second electrode. The plurality of bonding wires connect the second metal pattern and the second electrode. The second electrode includes a plurality of electrode pads and a resistor. The plurality of electrode pads include a first electrode pad and a second electrode pad. The resistor is connected between the first electrode pad and the second electrode pad. The plurality of bonding wires include a first bonding wire and a second bonding wire. The first bonding wire connects the first electrode pad and the second metal pattern. The second bonding wire connects the second electrode pad and the second metal pattern. The controller is configured to detect deterioration of the semiconductor device when a potential difference between the first metal pattern and the second metal pattern is above a first threshold.

In the semiconductor device according to the present invention, as the bonding wire that is connecting the second electrode and the second metal pattern deteriorates, a value of resistance between the second electrode and the second metal pattern changes. Since the second electrode is connected to the first metal pattern, the change in the resistance value is detected by the controller, as a potential difference between the first metal pattern and the second metal pattern.

If any of the first bonding wire and the second bonding wire deteriorates, a portion of current which had flown through the deteriorated bonding wire will then pass through the resistor connected between the first electrode pad and the second electrode pad. As a result, the current distribution to the first electrode pad and the second electrode pad changes, which increases the sheet resistance of the second electrode. In the semiconductor device according to the present invention, as the bonding wire deteriorates, the sheet resistance of the second electrode also includes, in addition to the combined resistance of the plurality of bonding wires. As a result, changes in the potential difference between the first metal pattern and the second metal pattern upon deterioration of the bonding wire is greater than the case where the second electrode is formed from a single electrode pad.

Advantageous Effects of Invention

According to the present invention, the detection of changes in the potential difference due to the deterioration of a bonding wire can be facilitated. As a result, an increased accuracy in detecting the deterioration of the semiconductor device can be achieved.

DESCRIPTION OF EMBODIMENTS

Figure 1:
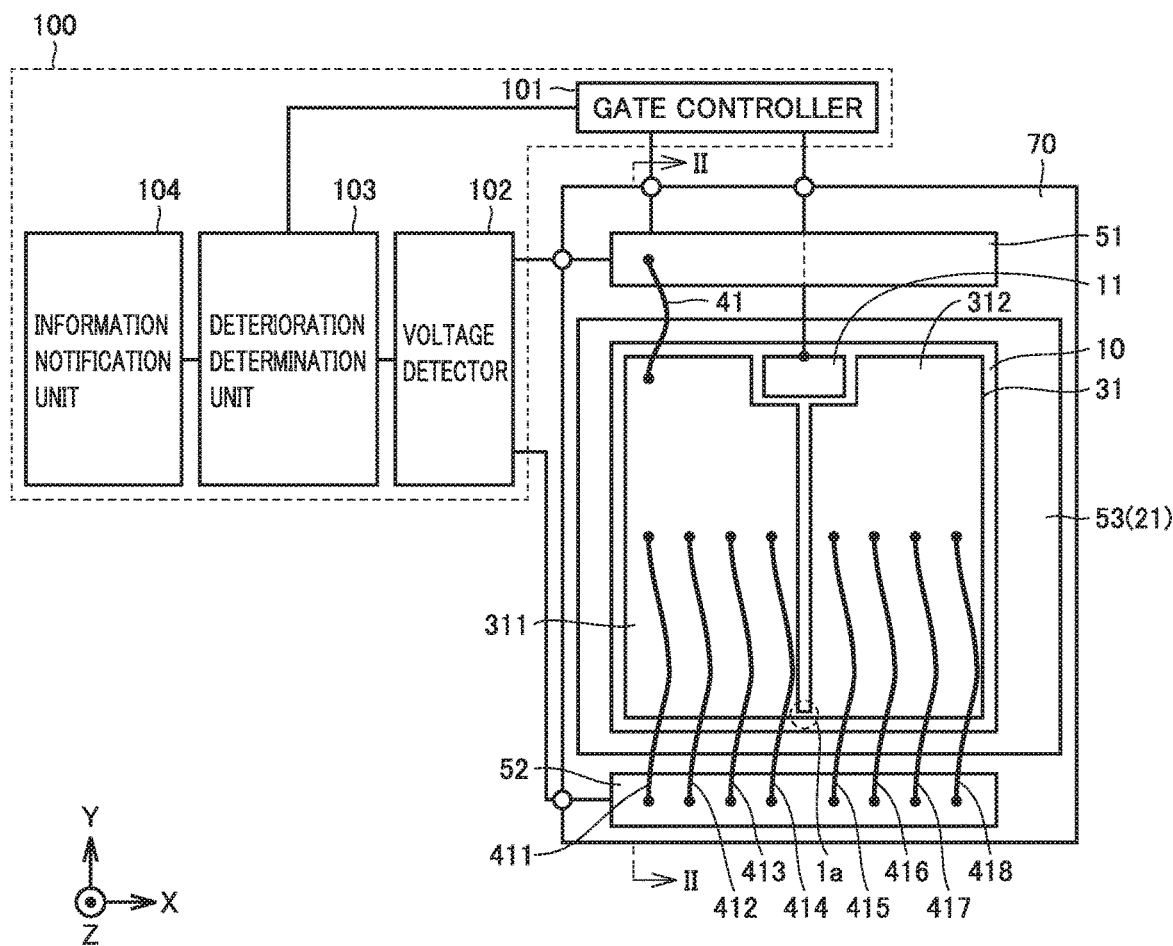
FIG. 1 is a diagram showing an overall configuration of a semiconductor device according to Embodiment 1.

Hereinafter, embodiments of the present invention will be described, with reference to the accompanying drawings. Note that like reference signs are used to refer to like or corresponding parts in the drawings, and the description thereof will, in principle, not be repeated.

Embodiment 1

Figure 2:
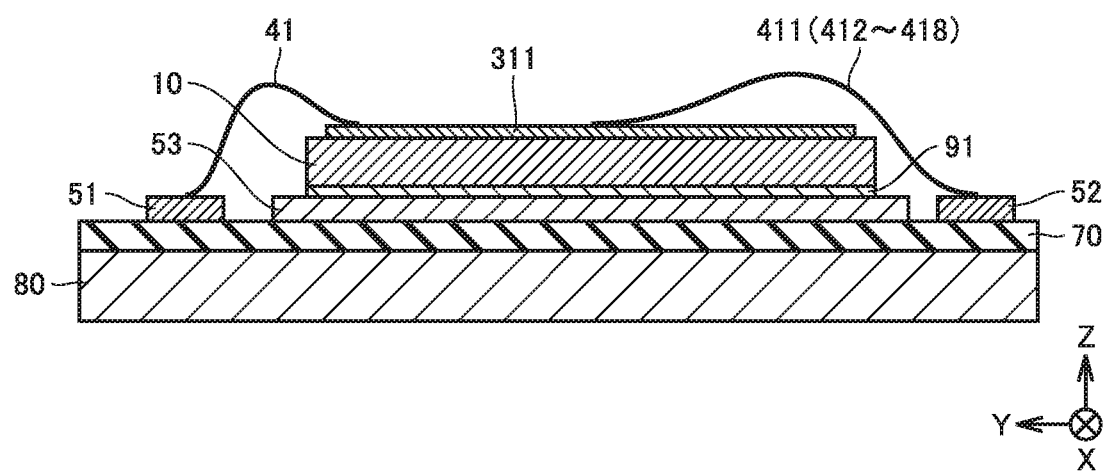
FIG. 2 is a cross-sectional view of the semiconductor device taken along II-II line of FIG. 1.

FIG. 1 is a diagram showing an overall configuration of a semiconductor device 1 according to Embodiment 1. FIG. 2 is a cross-sectional view of semiconductor device 1 taken along II-II line of FIG. 1. As shown in FIGS. 1 and 2, semiconductor device 1 includes a semiconductor element 10, a gate electrode 11, a collector electrode 21, an emitter electrode 31, bonding wires 41, 411, 412, 413, 414, 415, 416, 417, and 418, metal patterns 51, 52, and 53, an insulating material 70, a base plate 80, and a controller 100.

Referring to FIGS. 1 and 2, insulating material 70 is adhered to metal base plate 80. Metal patterns 51 to 53 are adhered to insulating material 70. Semiconductor element 10 is adhered to metal pattern 53 via a conductive adhesive 91. Metal patterns 51 to 53 each double as an interconnect pattern inside semiconductor device 1, and have capabilities of conveying a control signal and the principal current, which is associated with the switching of semiconductor element 10, to an electrode terminal at an edge portion of semiconductor element 10.

Semiconductor element 10 is, for example, an IGBT (Insulated Gate Bipolar Transistor). Semiconductor element 10 includes gate electrode 11, which is a control electrode, collector electrode 21 which is connected to a positive terminal, and emitter electrode 31 which is connected to a negative terminal. Semiconductor element 10 may be any semiconductor element, besides an IGBT, and may be a MOSFET (Metal-Oxide-Semiconductor Field-Effect Transistor), BJT (Bipolar Junction Transistor), GTO (Gate Turn-Off Thyristor), or GCT (Gate Commutated Turn-off Thyristor). For example, if semiconductor element 10 is a MOSFET, the drain electrode is connected to the positive terminal, and the source electrode is connected to the negative terminal.

Collector electrode 21 included in semiconductor element 10 is adhered to metal pattern 53 on insulating material 70, using conductive adhesive 91. Conductive adhesive 91 is, for example, a solder or sintered silver. Metal pattern 53 is, for example, copper (Cu) or aluminum (Al).

Emitter electrode 31, included in semiconductor element 10, includes a linear conductor 1a as a resistor, and electrode pads 311, 312. Linear conductor 1a connects electrode pads 311 and 312. Emitter electrode 31 includes aluminum, aluminum silicon alloy (AlSi), or gold (Au). In order to prevent the deterioration of emitter electrode 31 associated with the temperature changes in semiconductor element 10, a metal film, such as nickel (Ni) or copper, may be further formed on emitter electrode 31 by plating, deposition, or sputtering. Moreover, in the process of forming electrode pads 311, 312 on the surface of semiconductor element 10 during the fabrication of semiconductor element 10, electrode pads 311, 312 and linear conductor 1a can be formed simultaneously by deposition, sputtering, or plating, using a mask pattern having a structure including electrode pads 311, 312 and linear conductor 1a. After electrode pads 311, 312 are formed, linear conductors may be formed, using a metallic material, such as tungsten (W), which has a large resistance and is other than the metallic material from which electrode pads 311, 312 are formed. Since the width of linear conductor 1a corresponds to a resistance value of the resistor, the width is preferably smaller than the wire diameters of bonding wires 411 to 418. A general bonding wire diameter is about 400 μm. Thus, desirably, the width of linear conductor 1a is less than 400 μm.

Bonding wire 41 connects metal pattern 51 and electrode pad 311. Bonding wires 411 to 414 connect electrode pad 311 and metal pattern 52. Bonding wires 415 to 418 connect electrode pad 312 and metal pattern 52.

No current, other than small current for controlling the gate, flows through metal pattern 51 and bonding wire 41, and thus the potential difference between bonding wire 41 and metal pattern 51 is almost negligible. The potential of metal pattern 51 is equal to the potential at the junction between bonding wire 41 and emitter electrode 31. In other words, the potential difference between metal patterns 51 and 52 is substantially equal to the potential difference between emitter electrode 31 and metal pattern 52. The potential difference between emitter electrode 31 and metal pattern 52 is the sum value of the potential difference generated by the sheet resistance of emitter electrode 31 and the potential difference generated by the combined resistance of bonding wires 411 to 418. Accordingly, changes in the sum value of the sheet resistance of emitter electrode 31 and the combined resistance of bonding wires 411 to 418 is reflected to the potential difference between metal patterns 51 and 52.

If emitter electrode 31 is composed of a single electrode pad, and the sheet resistance of the electrode pad is as small as negligible as compared to the combined resistance of bonding wires 411 to 418, the potential difference between metal patterns 51 and 52 is primarily due to the combined resistance of bonding wires 411 to 418 connecting emitter electrode 31 and metal pattern 52. Even if the bonding wires 411 to 418 are deteriorated, the deterioration can be difficult to detect if changes in the combined resistance of bonding wires 411 to 418 are very small.

To address this, in Embodiment 1, emitter electrode 31 is divided into two electrode pads 311, 312 which are connected to each other by linear conductor 1a. If some of bonding wires 411 to 418 is debonded from emitter electrode 31 or disconnected, a portion of current which had flown through the debonded or disconnected bonding wire will then pass through linear conductor 1a into metal pattern 52 via other bonding wire. Linear conductor 1a has a non-negligible resistive component, as compared to the combined resistance of bonding wires 411 to 418. Thus, current passing through linear conductor 1a increases the sheet resistance of emitter electrode 31, thereby increasing the potential difference between metal patterns 51 and 52. As a result, changes in the potential difference between metal patterns 51 and 52, which are due to the deterioration of bonding wires 411 to 418, increase greater than the case where emitter electrode 31 is formed of a single electrode pad. According to semiconductor device 1, the detection of changes in the potential difference that are due to the deterioration of bonding wires 411 to 418 is facilitated. As a result, an increased accuracy in detecting the deterioration of semiconductor device 1 can be achieved.

Controller 100 includes a gate controller 101, a voltage detector 102, a deterioration determination unit 103, and an information notification unit 104. Gate controller 101 is connected to metal pattern 51. Using the potential of metal pattern 51 as a reference potential, gate controller 101 applies a gate voltage to gate electrode 11 to control the principal current (e.g., a few amperes to several hundreds amperes) flow from collector electrode 21 to emitter electrode 31. Gate controller 101 stops semiconductor device 1, according to a shut-off signal from deterioration determination unit 103.

Voltage detector 102 is connected to metal patterns 51 and 52. Voltage detector 102 detects a potential difference between metal patterns 51 and 52, and outputs a signal indicative of the potential difference to deterioration determination unit 103. If the potential difference is above a first threshold, deterioration determination unit 103 outputs to information notification unit 104 a signal instructing to alert a user. If the potential difference is above a second threshold (greater than the first threshold), the safety of semiconductor device 1 cannot be guaranteed. Thus, deterioration determination unit 103 outputs to gate controller 101 a shut-off signal instructing to shut off the energization of conduction semiconductor element 10 to stop semiconductor device 1. If the potential difference is above the second threshold, deterioration determination unit 103 also outputs to information notification unit 104 a signal instructing to notify the user of error information. Based on the signal from deterioration determination unit 103, information notification unit 104 notifies the user of predetermined information.

Figure 3:
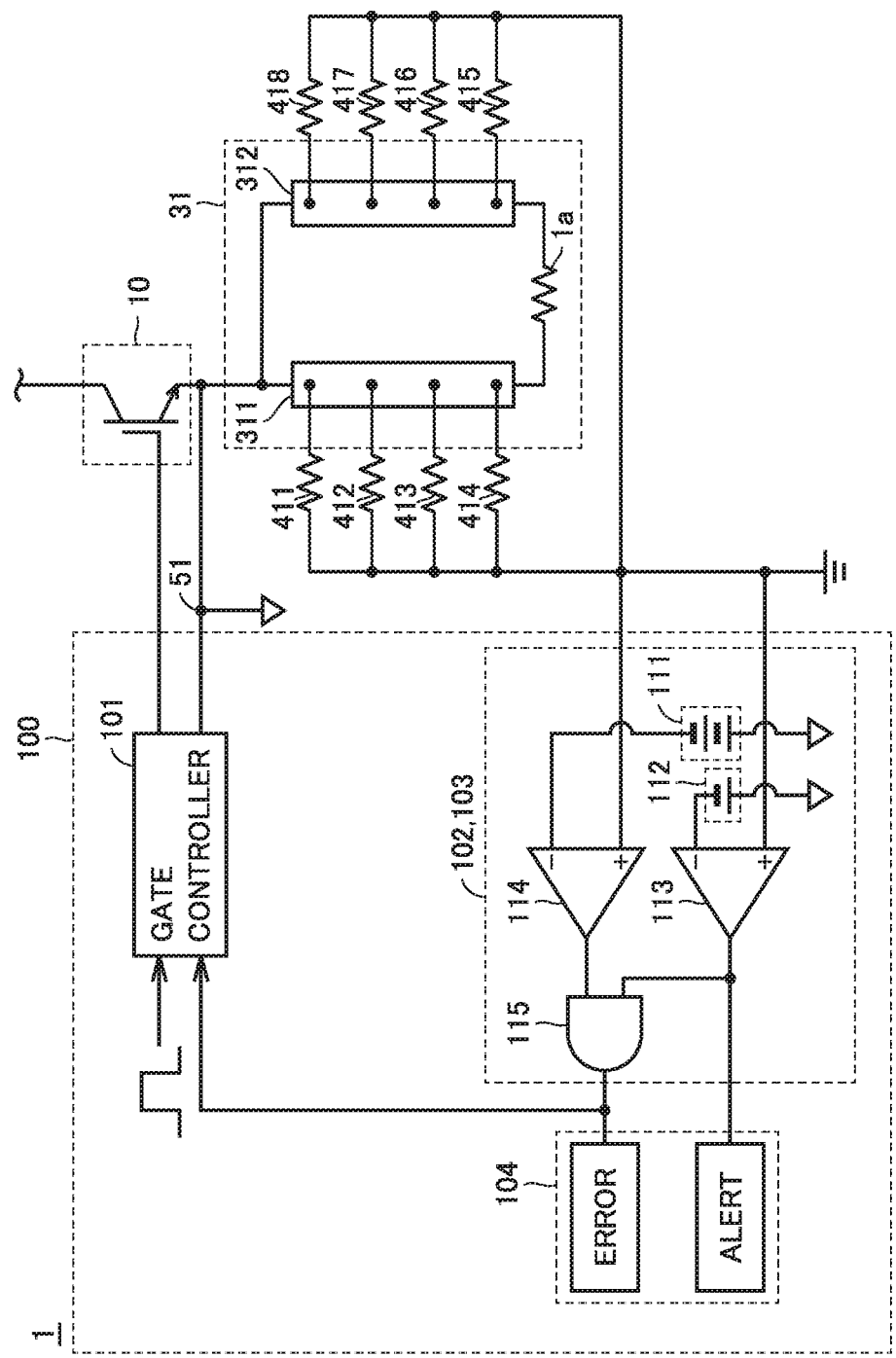
FIG. 3 is a diagram for illustrating one example of a circuit structure of a voltage detector and a deterioration determination unit included in a controller shown in FIG. 1.

FIG. 3 is a diagram for illustrating one example of a circuit structure of voltage detector 102 and deterioration determination unit 103 included in controller 100 of FIG. 1. In FIG. 3, semiconductor element 10 of FIG. 1 is indicated by a circuit symbol for an IGBT, linear conductor 1a and bonding wires 411 to 418 are indicated as resistors, and metal pattern 51 is indicated as points of connection on the circuit. The reference potential is a potential of metal pattern 51. The connecting relationship between semiconductor element 10, emitter electrode 31, linear conductor 1a, bonding wires 411 to 418, and metal pattern 51 is the same as FIG. 1, and thus the description will not be repeated.

As shown in FIG. 3, voltage detector 102 and deterioration determination unit 103 are formed of negative supplies 111, 112, comparators 113, 114, and an AND circuit 115. Comparator 113 has a non-inverting input terminal connected to one end of each of bonding wires 411 to 418. Comparator 113 has an inverting input terminal connected to negative supply 112. Comparator 114 has a non-inverting input terminal connected to the one end of each of bonding wires 411 to 418. Comparator 114 has an inverting input terminal connected to negative supply 111. Supply voltage of negative supply 111 is greater than supply voltage of negative supply 112. Comparator 113 has an output terminal connected to information notification unit 104 and one of a pair of input terminals of AND circuit. Comparator 114 has an output terminal connected to the other one of the pair of input terminals of AND circuit 115. AND circuit 115 has an output terminal connected to information notification unit 104 and gate controller 101.

If some of bonding wires 411 to 418 deteriorate and are debonded from emitter electrode 31 or disconnected, a current flows through linear conductor 1a. As a result, voltage that is input to comparators 113 and 114 increases greater than before the bonding wire is debonded or disconnected. Since the reference potential is the source potential of gate controller 101, potential input to comparators 113 and 114 is negative potential, and the negative potential is supplied from negative supplies 112 and 111. Negative supply 112 outputs a voltage corresponding to the first threshold to the inverting input terminal of comparator 113. Negative supply 111 outputs a voltage corresponding to the second threshold to the inverting input terminal of comparator 114.

If some of bonding wires 411 to 418 deteriorate and voltage input to the non-inverting input terminal of comparator 113 reaches the first threshold, an output signal of comparator 113 changes from L signal to H signal. Upon receipt of H signal from comparator 113, information notification unit 104 alerts the user. If the some of bonding wires 411 to 418 deteriorate even worse and the voltage input to comparator 114 reaches the second threshold, the output signal of comparator 114 changes from L signal to H signal. Upon receipt of H signal from each of comparators 113 and 114, AND circuit 115 outputs H signal to information notification unit 104 and gate controller 101. Upon receipt of H signal from AND circuit 115, information notification unit 104 notifies the user of error information. Upon receipt of a shut-off signal (H signal) from AND circuit 115, gate controller 101 shuts off the energization of semiconductor element 10 to stop semiconductor device 1.

In semiconductor device 1, metal pattern 51 is used as the reference potential to control voltage and determine deterioration of bonding wires, which obviates the need for a metal pattern that is dedicated to determining the deterioration of the bonding wires. Consequently, size reduction of semiconductor device 1 can be achieved. Moreover, in semiconductor device 1, further size reduction of semiconductor device 1 can be achieved by integrating gate controller 101, voltage detector 102, deterioration determination unit 103, and information notification unit 104 on a same control board.

Semiconductor element 10 generates heat at every switching operation or conduction operation. Consequently, the connections between emitter electrode 31 and bonding wires 41, 411 to 418 are repeatedly heated and cooled at switching operation of semiconductor element 10. The connections are subjected to heat stress. Consequently, cracks are likely to be developed at or near the connections between emitter electrode 31 and bonding wires 41, 411 to 418. If bonding wires 41, 411 to 418 further deteriorate, they are debonded from emitter electrode 31 or bonding wires 41, 411 to 418 themselves are disconnected, causing semiconductor element 10 to fail. Heat is hardly dissipated, particularly, near the center portion of semiconductor element 10. Thus, the temperature near the center portion of semiconductor element 10 increases easily. Due to this, bonding wires 41, 411 to 418 often deteriorate starting from those near the center portion of the semiconductor element. Bonding wire 41 is an important bonding wire that is used as a reference according to which the deterioration of bonding wires is detected and the gate is controlled. If bonding wire 41 is debonded from emitter electrode 31 or disconnected, semiconductor element 10 becomes out of control. For this reason, bonding wire 41 is connected to emitter electrode 31, at an edge portion of semiconductor element 10 in semiconductor device 1, the edge portion being unlikely to be heated.

Although not shown in FIGS. 1 and 2 for the purposes of visual clarity, it should be noted that silicone gel or epoxy resin is filled over and seals the top surfaces of semiconductor element 10 and insulating material 70 to protect and guarantee the insulating properties of semiconductor element 10 and bonding wire 41, 411 to 418.

Figure 4:
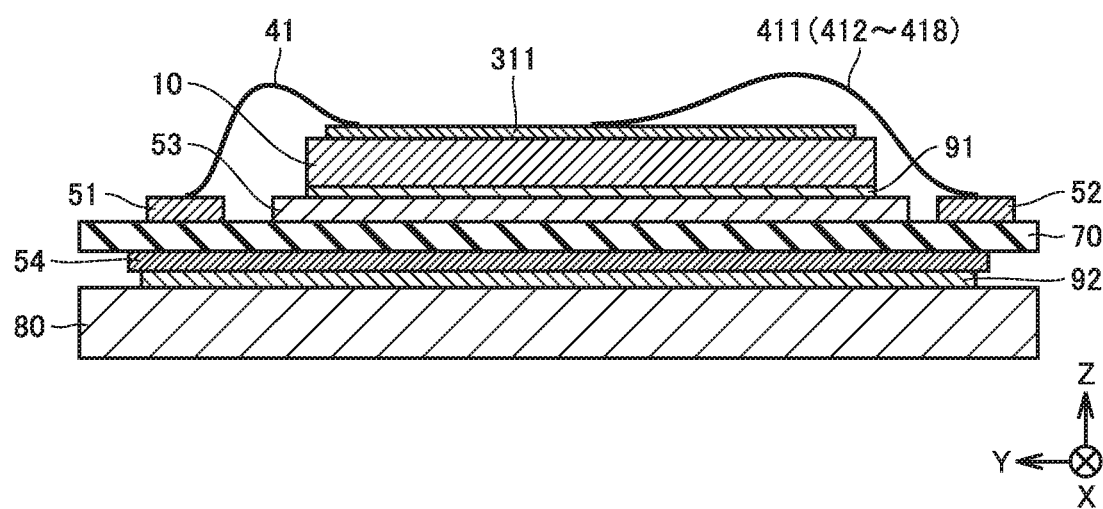
FIG. 4 is a cross-sectional view of a semiconductor device according to a variation of Embodiment 1.

Embodiment 1 has been described with reference to insulating material 70 being connected to base plate 80, as shown in FIG. 2. The structure of the semiconductor device according to the present invention is not limited to the structure shown in FIG. 2, and may be a structure (a DBC (Direct Bonded Copper) substrate or a DBA (Direct Bonded Aluminum) substrate), in which insulating material 70 is ceramic and disposed between metal pattern 53 and a metal pattern 54, as semiconductor device 1A shown in FIG. 4, for example. In semiconductor device 1A, metal pattern 54 is connected to base plate 80 via a conductive adhesive 92.

As described above, according to the semiconductor device of Embodiment 1 and the variation thereof, an increased accuracy in detecting the deterioration of the semiconductor device can be achieved.

Embodiment 2

Figure 5:
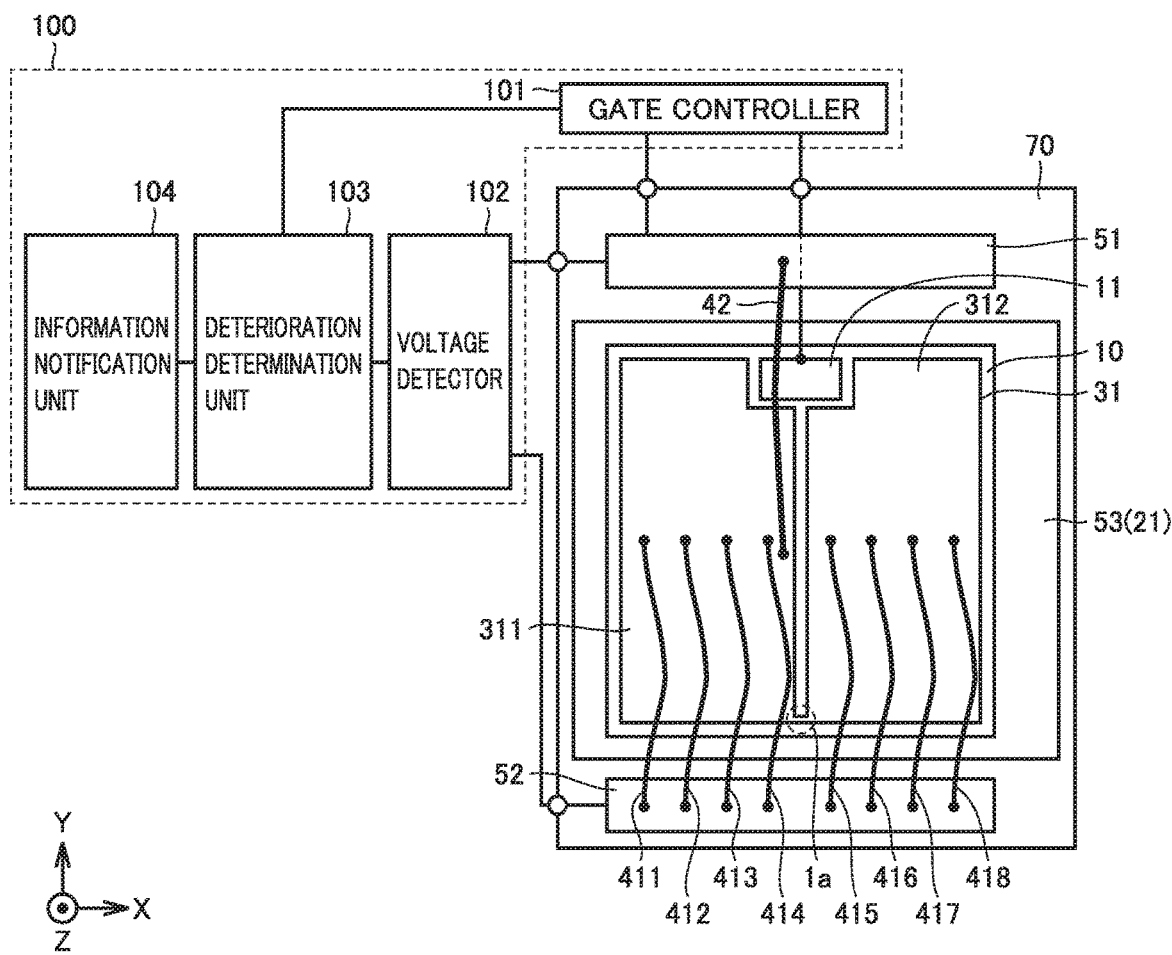
FIG. 5 is an overall configuration of a semiconductor device according to Embodiment 2.

FIG. 5 is an overall configuration of a semiconductor device 2 according to Embodiment 2. The configuration of semiconductor device 2 includes a bonding wire 42, instead of bonding wire 41 of semiconductor device 1 of FIG. 1. The other configurations are the same as those shown in FIG. 1, and thus the descriptions thereof will not be repeated.

Due to repetitive stress caused when semiconductor element 10 is heated and when cooled, the bonding wires connected to an emitter electrode 31 are easily debonded from emitter electrode 31 or disconnected, starting from those near the center portion of semiconductor element 10. Bonding wire 42 is less easily debonded from emitter electrode 31 or disconnected when it is disposed at an edge portion of semiconductor element 10 rather than at the center portion, while the accuracy in detecting the deterioration of semiconductor device 2 can be increased if bonding wire 42 is disposed at the center portion of semiconductor element 10, rather than at an edge portion. In the following, description will be given, with reference to FIG. 6, regarding reasons why an increased accuracy in detecting the deterioration of the semiconductor device can be achieved when bonding wire 42 is disposed at the center portion of semiconductor element 10, rather than at an edge portion.

Figure 6:
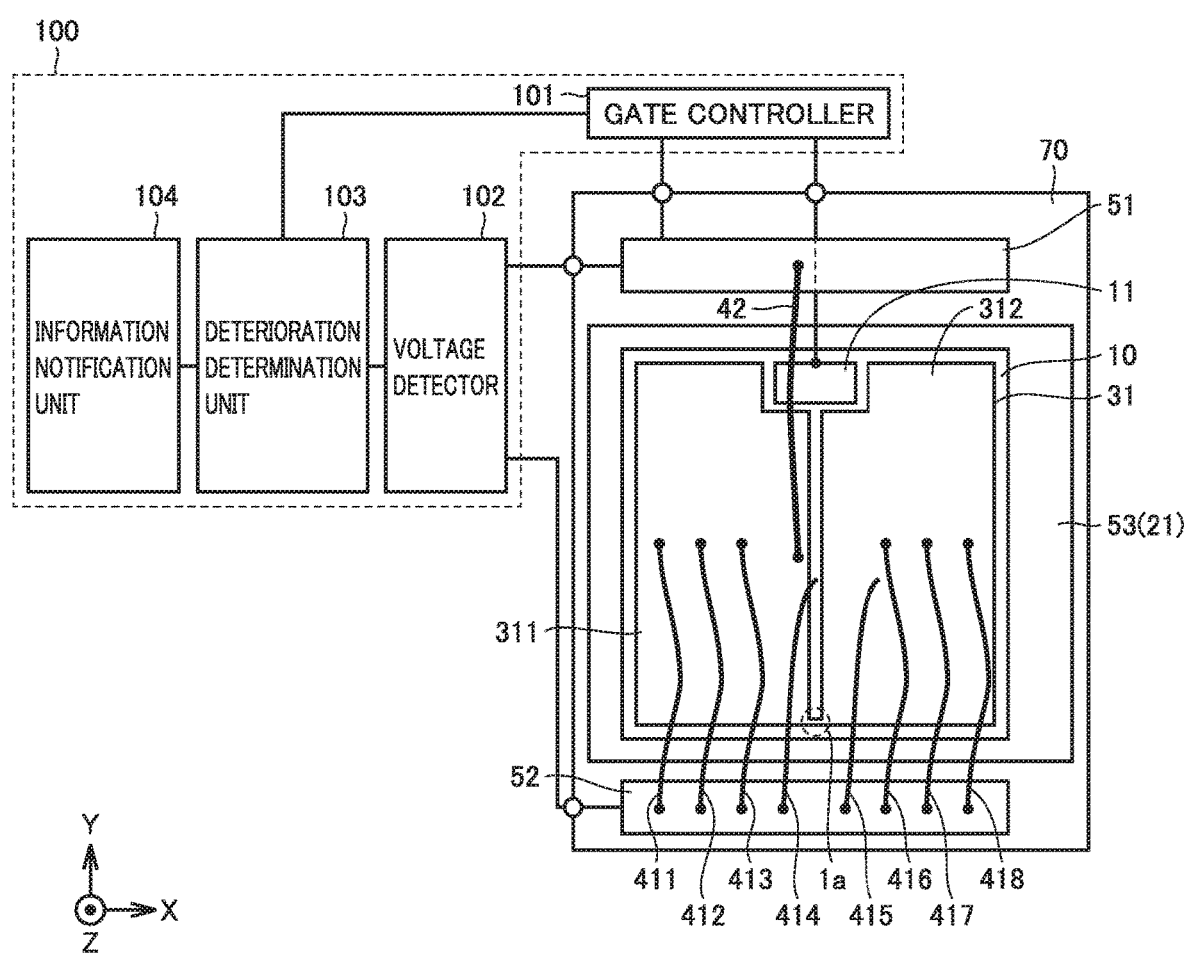
FIG. 6 is an overall configuration diagram showing bonding wires that are disposed at the center portion of semiconductor element are debonded from semiconductor element or disconnected.

FIG. 6 is an overall configuration diagram showing bonding wires 414 and 415 that are disposed at the center portion of semiconductor element 10 are debonded from emitter electrode 31 or disconnected, among bonding wires 411 to 418. Current near the debonded or disconnected bonding wire flows to a bonding wire that is not debonded or disconnected. As bonding wires 411 to 418 are debonded or disconnected, starting from those near the center portion of semiconductor element 10, the current path is extended from the center portion of semiconductor element 10 to a bonding wire that is not debonded or disconnected. As such, the distance through which the current flows within the electrode surface increases, which increases the sheet resistance of emitter electrode 31 to an extent that can no longer be ignored. Thus, the longer the distance, the greater the potential difference between metal pattern 52 and bonding wire 42 that is disposed at the center portion of semiconductor element 10. In other words, an increased potential difference is detected by voltage detector 102. Accordingly, an increased accuracy in detecting the deterioration of semiconductor device 2 can be achieved better by disposing bonding wire 42 at the center portion of semiconductor element 10, rather than at an edge portion.

In semiconductor device 2, the cross-sectional diameter of bonding wire 42 is increased greater than the cross-sectional diameters of bonding wires 411 to 418, thereby increasing the cross-sectional area of bonding wire 42 greater than the cross-sectional areas of bonding wires 411 to 418. Bonding wire 42 is difficult to deteriorate (debond or disconnect) (has long life), as compared to bonding wires 411 to 418.

Figure 7:
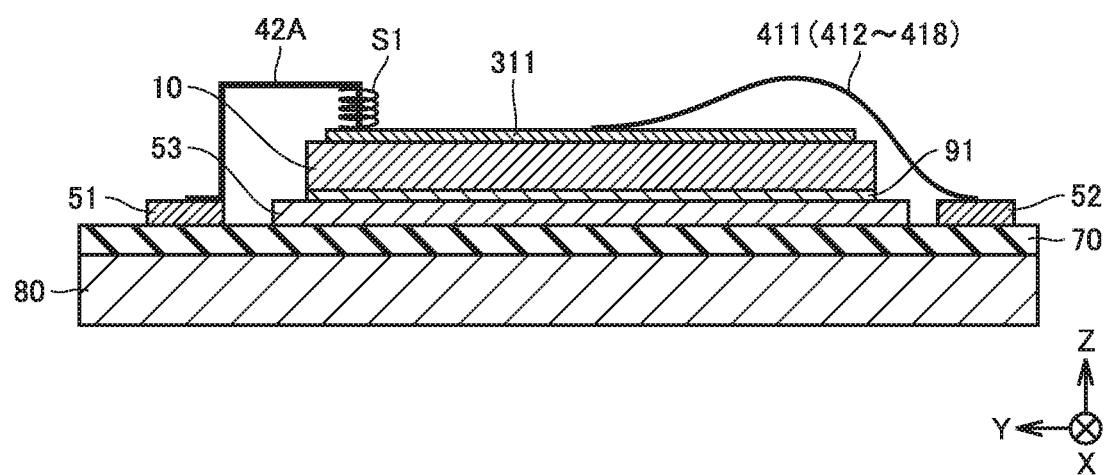
FIG. 7 is a cross-sectional view of a semiconductor device according to a variation of Embodiment 2.

The means for making bonding wire 42 more difficult to deteriorate than bonding wires 411 to 418 is not limited to increasing the cross-sectional area of bonding wire 42 greater than bonding wires 411 to 418. For example, a spring contact 42A, as shown in FIG. 7, can be used, instead of bonding wire 42. Spring contact 42A includes a spring S1 as an elastic body. As spring S1 gives a bias to one end of spring contact 42A against electrode pad 311, spring contact 42A can be inhibited from being debonded from electrode pad 311 and disconnected.

As described above, according to the semiconductor device of Embodiment 2 and the variation thereof, an increased accuracy in detecting the deterioration of the semiconductor device can be achieved. Moreover, the semiconductor device according to Embodiment 2 and the variation thereof can further increase the accuracy in detecting the deterioration of the semiconductor device, as compared to Embodiment 1.

Embodiment 3

Embodiments 1 and 2 have been described with reference to the emitter electrode including two electrode pads.

Embodiment 3 will be described with reference to an emitter electrode including three or more electrode pads.

Figure 8:
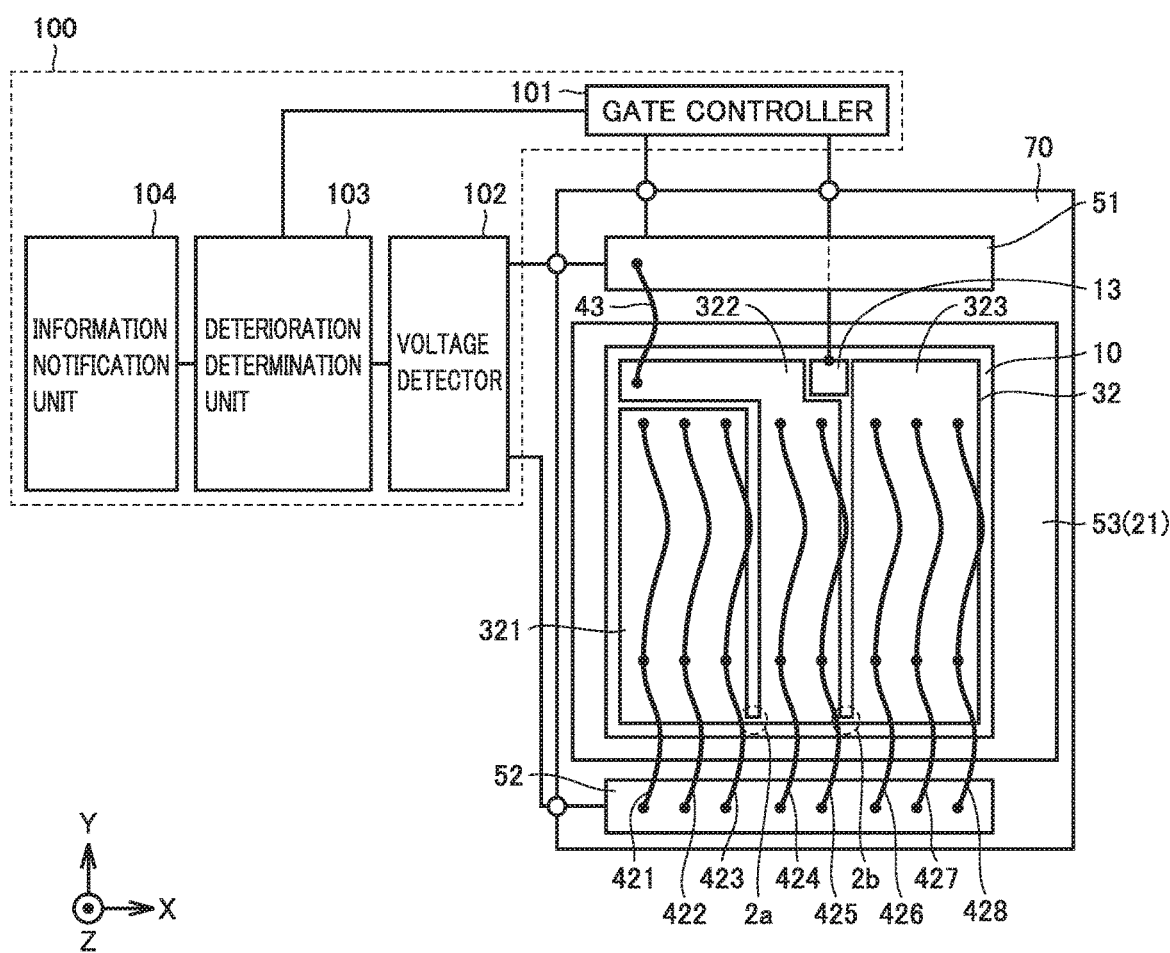
FIG. 8 is an overall configuration diagram of a semiconductor device according to Embodiment 3.

FIG. 8 is an overall configuration diagram of a semiconductor device 3 according to Embodiment 3. The configurations of semiconductor device 3 shown in FIG. 8 include an emitter electrode 32, instead of emitter electrode 31 included in semiconductor device 1 of FIG. 1, a gate electrode 13, instead of gate electrode 11, and bonding wires 43, 421, 422, 423, 424, 425, 426, 427, and 428, instead of bonding wires 41, 411 to 418. The remaining configurations are the same as those shown in FIG. 1, and thus the descriptions thereof will not be repeated.

As shown in FIG. 8, emitter electrode 32 includes electrode pads 321, 322, and 323. Electrode pads 321 and 322 are connected by a linear conductor 2a. Electrode pads 322 and 323 are connected by a linear conductor 2b.

Bonding wire 43 connects a metal pattern 51 and electrode pad 322. Bonding wires 421 to 423 connect electrode pad 321 and a metal pattern 52. Bonding wires 421 to 423 are each connected to electrode pad 321 at two points. In other words, bonding wires 421 to 423 are each stitched to electrode pad 321. Bonding wires 424, 425 connect electrode pad 322 and metal pattern 52. Bonding wires 424, 425 are each stitched to electrode pad 322. Bonding wires 426 to 428 connect electrode pad 323 and metal pattern 52. Bonding wires 426 to 428 are each stitched to electrode pad 323.

Electrode pad 322 is in an L shape having a portion extending in Y-axis direction and a portion extending in X-axis direction. The portion of electrode pad 322 that extends in Y-axis direction is disposed between electrode pads 321 and 323 (the center portion of semiconductor element 10) in X-axis direction. The portion of electrode pad 322 that extends in X-axis direction extends from the center portion of semiconductor element 10 to an edge portion. Electrode pad 322 is connected to bonding wire 43, at the edge portion. The portion of electrode pad 322 which extends in Y-axis direction (the center portion of semiconductor element 10) is connected to bonding wires 424, 425.

Since bonding wire 43 and electrode pad 321 are connected via linear conductor 2a, electrical distances between bonding wire 43 and bonding wires 421, 422, 423 are greater than electrical distances between bonding wire 43 and bonding wires 424, 425. Moreover, since bonding wire 43 and electrode pad 323 are connected via linear conductor 2b, electrical distances between bonding wire 43 and bonding wires 426 to 428 are greater than the electrical distances between bonding wire 43 and bonding wires 424, 425. Accordingly, as bonding wire 421 to 428 are debonded or disconnected, starting from bonding wires 424, 425 that are disposed at the center portion of semiconductor element 10, an electrical distance increases from bonding wire 43 to a bonding wire that is not debonded or disconnected. Owing to this, the accuracy in detecting the deterioration of semiconductor device 3 can further be increased. Moreover, since bonding wire 43 is connected to an edge portion of semiconductor element 10, bonding wire 43 can be suppressed from deterioration. In other words, according to semiconductor device 3, the accuracy in detecting the deterioration of semiconductor device 3 can be further increased, while suppressing deterioration of bonding wire 43.

Figure 9:
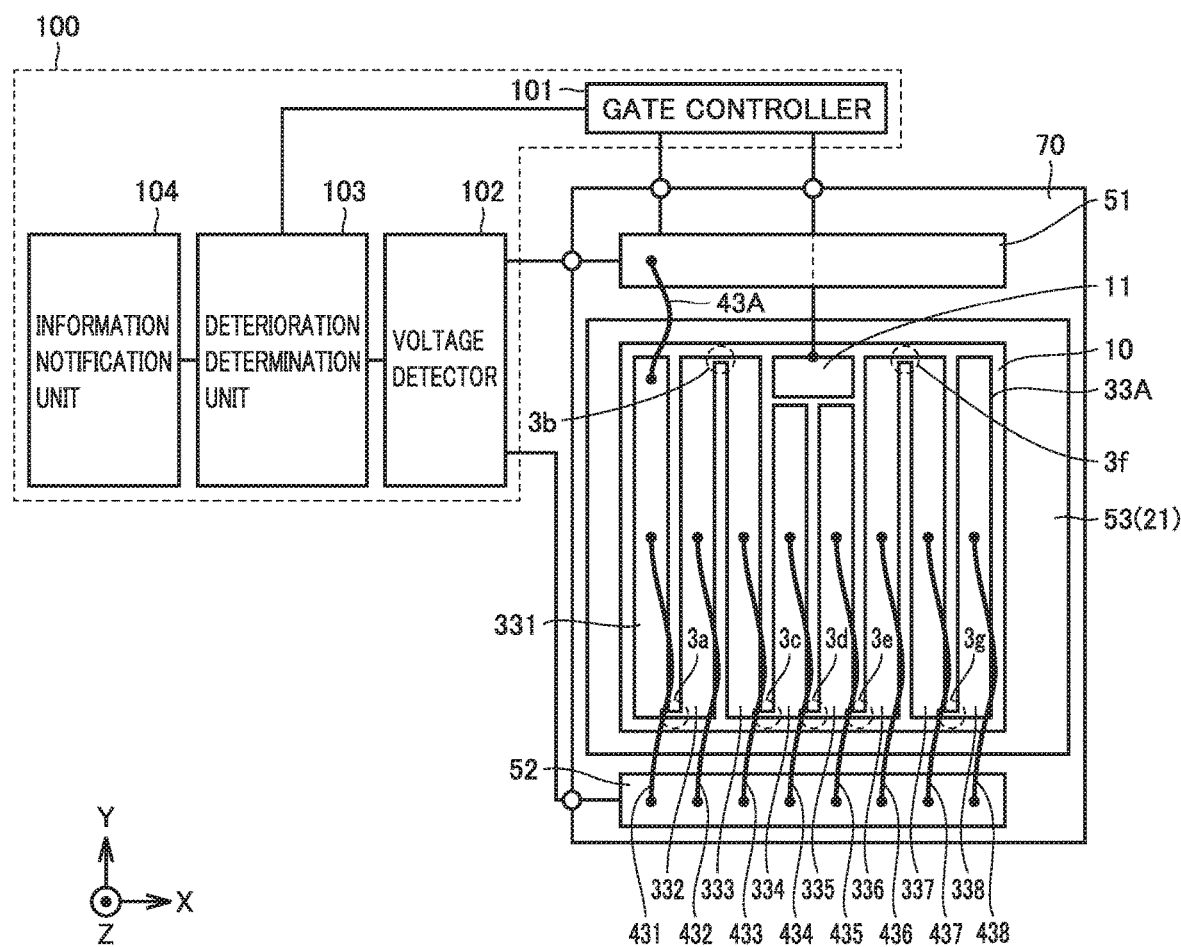
FIG. 9 is an overall configuration diagram of a semiconductor device according to Variation 1 of Embodiment 3.

FIG. 9 is an overall configuration diagram of a semiconductor device 3A according to Variation 1 of Embodiment 3. The configurations of semiconductor device 3A shown in FIG. 9 include an emitter electrode 33, instead of emitter electrode 31 included in semiconductor device 1 of FIG. 1, and includes bonding wires 43A, 431, 432, 433, 434, 435, 436, 437, and 438, instead of bonding wires 41, 411 to 418. The remaining configurations are the same as those shown in FIG. 1, and thus the descriptions thereof will not be repeated.

As shown in FIG. 9, emitter electrode 33A includes electrode pads 331, 332, 333, 334, 335, 336, 337, and 338 and linear conductors 3a, 3b, 3c, 3d, 3e, 3f, and 3g. Electrode pads 331 to 338 are each a rectangular electrode pad extending in Y-axis direction, and are aligned in X-axis direction, substantially evenly spaced from one another. In plan view of semiconductor device 3A from Z-axis direction, electrode pads 331 to 338 are disposed regularly (in a continuous pattern).

Electrode pads 331 and 332 are connected by linear conductor 3a. Electrode pads 332 and 333 are connected by linear conductor 3b. Electrode pads 333 and 334 are connected by linear conductor 3c. Electrode pads 334 and 335 are connected by linear conductor 3d. Electrode pads 335 and 336 are connected by linear conductor 3e. Electrode pads 336 and 337 are connected by linear conductor 3f. Electrode pads 337 and 338 are connected by linear conductor 3g.

Electrode pad 331 is connected to a metal pattern 51 by bonding wire 43A. Electrode pads 331 to 338 and metal pattern 52 are connected by bonding wires 431 to 438, respectively.

As bonding wires 431 to 438 deteriorate, starting from those at the center portion of semiconductor element 10, a potential difference detected by voltage detector 102 increases as bonding wires 431 to 438 are disconnected or bonding wires 431 to 438 are debonded from electrode pads 331 to 338. Owing to this, according to semiconductor device 3A, the number of bonding wires 431 to 438 that have been debonded or disconnected can be detected with high accuracy.

Although not shown in FIG. 9, a guard ring is provided at a portion of the outer periphery of semiconductor element 10 where the emitter electrode 33 is not deposited. Moreover, routing lines for the gate interconnect are embedded in the outer periphery. Furthermore, routing lines for the gate interconnect may be embedded in between electrode pads 331 to 338. Due to this, variations in delay of a gate signal within semiconductor element 10 occur if the arrangement pattern of the multiple electrode pads included in emitter electrode 33 is complicated. As a result, for example, semiconductor element 10 can oscillate or the temperature distribution can occur.

Figure 10:
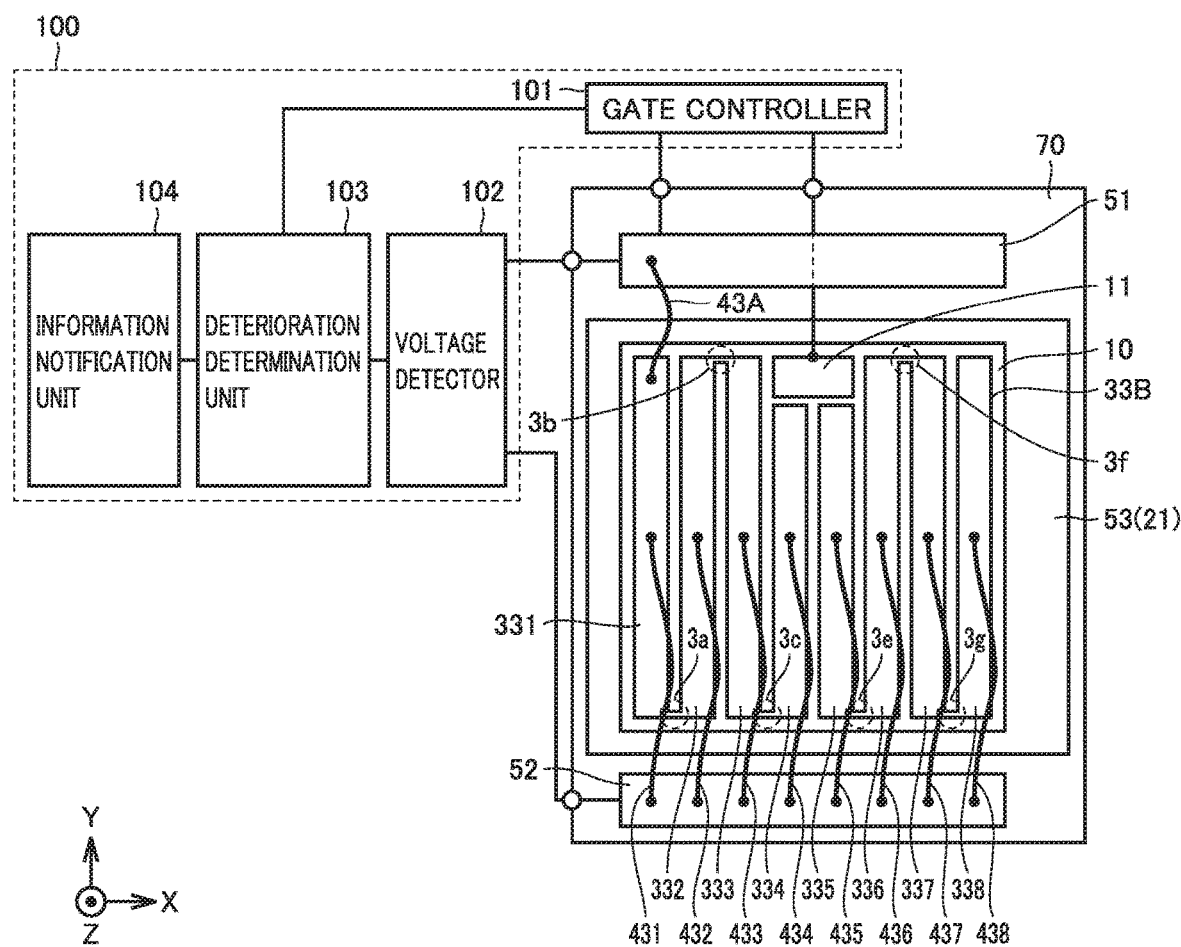
FIG. 10 is an overall configuration diagram of a semiconductor device according to Variation 2 of Embodiment 3.

Thus, by removing linear conductor 3d at the lower center of the emitter electrode 33 of FIG. 9 as a semiconductor device 3B shown in FIG. 10, a gate signal input from a gate electrode 11 passes through between electrode pads 334 and 335, besides the outer periphery of the semiconductor element. As a result, variations in delay of the gate signal can be suppressed.

Figure 11:
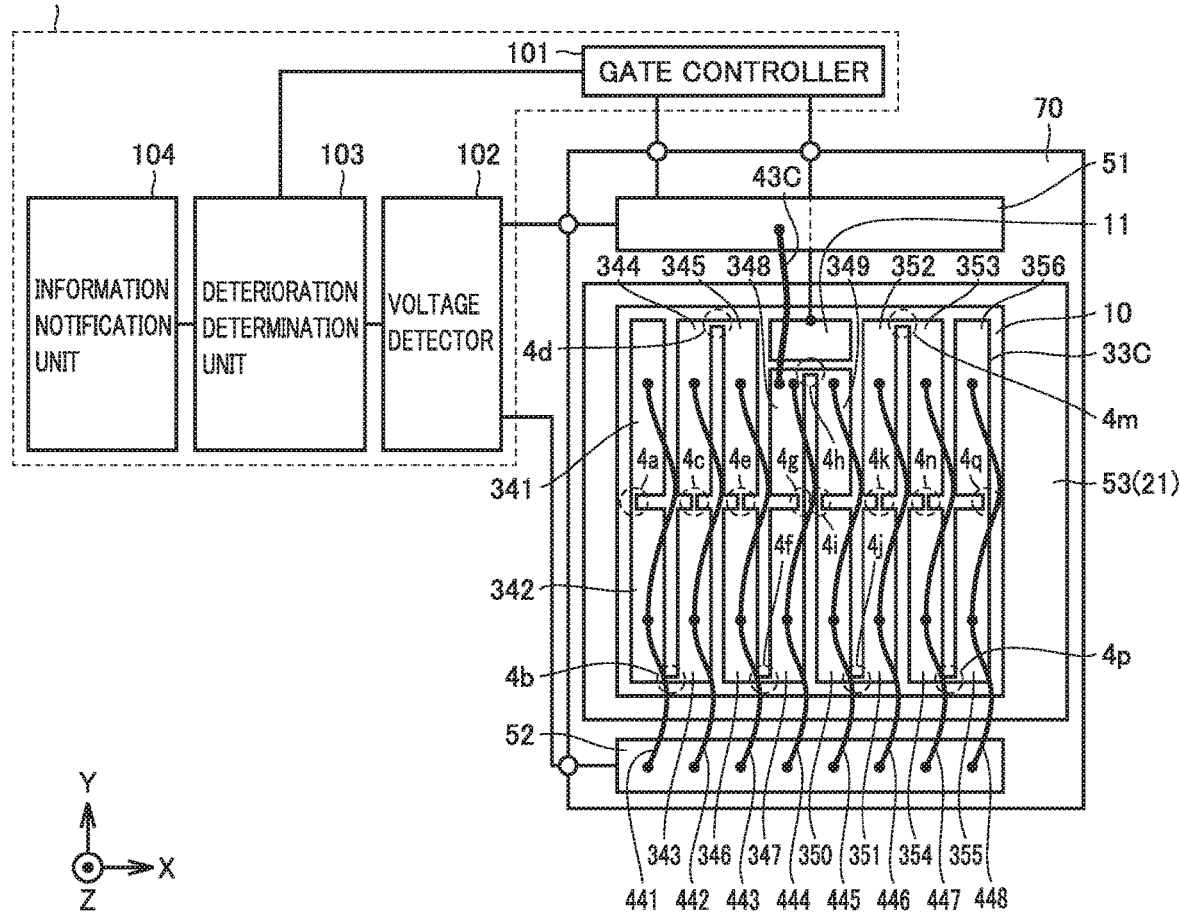
FIG. 11 is an overall configuration diagram of a semiconductor device according to Variation 3 of Embodiment 3.

FIG. 11 is an overall configuration diagram of a semiconductor device 3C according to Variation 3 of Embodiment 3. The configurations of semiconductor device 3C shown in FIG. 11 include an emitter electrode 33C, instead of emitter electrode 31 included in semiconductor device 1 of FIG. 1, and include bonding wires 43C, 441, 442, 443, 444, 445, 446, 447, and 448, instead of bonding wires 41, 411 to 418. The remaining configurations are the same as those shown in FIG. 1, and thus the descriptions thereof will not be repeated.

Emitter electrode 33C includes electrode pads 341 to 356, and linear conductors 4a, 4b, 4c, 4d, 4e, 4f, 4g, 4h, 4i, 4j, and 4k, 4m, 4n, 4p, 4q. Electrode pads 341 to 356 are each a rectangular electrode pad extending in Y-axis direction.

Electrode pads 341, 344, 345, 348, 349, 352, 353, 356 are aligned in X-axis direction, substantially evenly spaced from one another. Electrode pads 342, 343, 346, 347, 350, 351, 354, 355 are aligned in X-axis direction, substantially evenly spaced from one another, and aligned with electrode pads 341, 344, 345, 348, 349, 352, 353, 356, respectively, in Y-axis direction.

Electrode pad 341 is connected to electrode pad 342 by linear conductor 4a. Electrode pad 342 is connected to electrode pad 343 by linear conductor 4b. Electrode pad 343 is connected to electrode pad 344 by linear conductor 4c. Electrode pad 344 is connected to electrode pad 345 by linear conductor 4d. Electrode pad 345 is connected to electrode pad 346 by linear conductor 4e. Electrode pad 346 is connected to electrode pad 347 by linear conductor 4f. Electrode pad 347 is connected to electrode pad 348 by linear conductor 4g. Electrode pad 348 is connected to electrode pad 349 by linear conductor 4h. Electrode pad 349 is connected to electrode pad 350 by linear conductor 4i. Electrode pad 350 is connected to electrode pad 351 by linear conductor 4j. Electrode pad 351 is connected to electrode pad 352 by linear conductor 4k. Electrode pad 352 is connected to electrode pad 353 by linear conductor 4m. Electrode pad 353 is connected to electrode pad 354 by linear conductor 4n. Electrode pad 354 is connected to electrode pad 355 by linear conductor 4p. Electrode pad 355 is connected to electrode pad 356 by linear conductor 4q.

Bonding wire 43C connects metal pattern 51 and electrode pad 348. Bonding wires 441 to 448 respectively connect electrode pads 341, 344, 345, 348, 349, 352, 353, 356 and metal pattern 52. Bonding wires 441, 442, 443, 444, 445, 446, 447, and 448 connect metal pattern 52 and electrode pads 342, 343, 346, 347, 350, 351, 354, and 355, respectively. Bonding wires 441 to 448 are each stitched to electrode pads 342, 343, 346, 347, 350, 351, 354, and 355, respectively.

As bonding wires 441 to 448 are disconnected or debonded from electrode pads 341 to 356, an increased potential difference is detected by voltage detector 102. Owing to this, according to semiconductor device 3C, the number of bonding wires 441 to 448 that have been debonded or disconnected can be detected with high accuracy.

As described above, according to the semiconductor device of Embodiment 3 and Variations 1 to 3 thereof, an increased accuracy in detecting the deterioration of the semiconductor device can be achieved.

Embodiment 4

Embodiments 1 to 3 have been described with reference to using the potential difference between two metal patterns to detect the deterioration of the semiconductor device. Embodiment 4 will be described with reference to detecting the deterioration of a semiconductor device by using a current value flow through the metal pattern, in addition to the potential difference.

Figure 12:
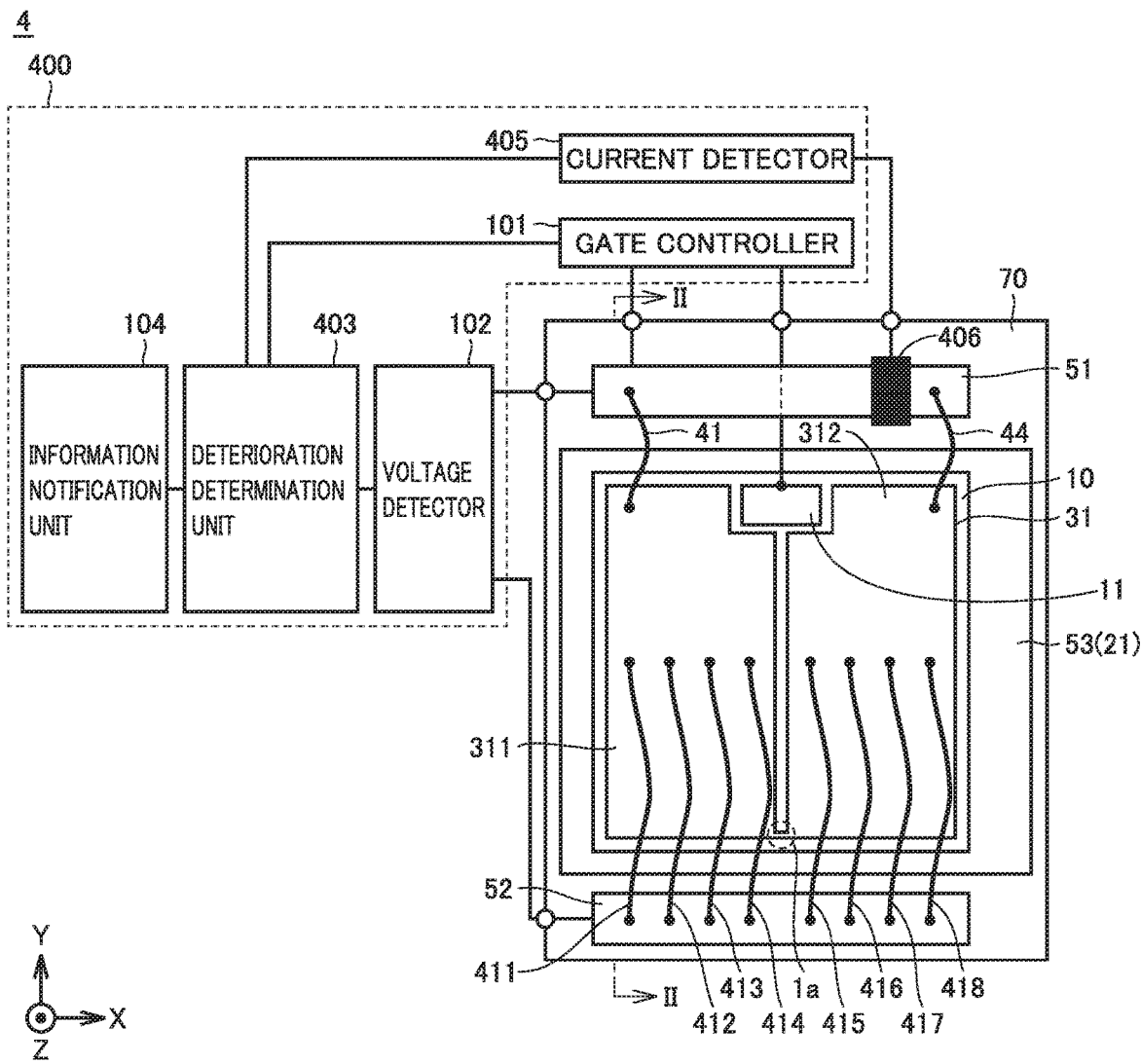
FIG. 12 is an overall configuration diagram of a semiconductor device according to Embodiment 4.

FIG. 12 is an overall configuration diagram of a semiconductor device 4 according to Embodiment 4. The configurations of semiconductor device 4 shown in FIG. 12 include a deterioration determination unit 403, instead of deterioration determination unit 103 of FIG. 1, and further includes a current detector 405, a current sensor 406, and a bonding wire 44, in addition to the configurations of semiconductor device 1 of FIG. 1. The remaining configurations are the same as those shown in FIG. 1, and thus the descriptions thereof will not be repeated.

As described with reference to Embodiment 1, if some of bonding wires 411 to 418 are debonded or disconnected, a portion of current which had flown through bonding wires 411 to 418 will then pass through linear conductor 1a into metal pattern 52 via other bonding wire.

As shown in FIG. 12, in semiconductor device 4, emitter electrode 312 and metal pattern 51 are connected by bonding wire 44. The portion of current which had flown into metal pattern 52 will then flow into metal pattern 51 via bonding wire 41 or 44. Current sensor 406 detects the current value flow into metal pattern 51.

Current sensor 406 outputs the detected current value to current detector 405. Current detector 405 outputs a signal indicative of the current value from current sensor 406 to deterioration determination unit 403.

Deterioration determination unit 403 outputs to information notification unit 104 a signal instructing to alert a user if the current value is above a third threshold. If the current value is above a fourth threshold (greater than the third threshold), the safety of semiconductor device 4 cannot be guaranteed. Thus, deterioration determination unit 403 outputs to gate controller 101 a shut-off signal instructing to shut off the energization of semiconductor element 10 to stop semiconductor device 4. If the potential difference is above the fourth threshold, deterioration determination unit 403 also outputs to information notification unit 104 a signal instructing to notify the user of error information. Based on the signal from deterioration determination unit 403, information notification unit 104 notifies the user of predetermined information.

As described above, according to the semiconductor device of Embodiment 4, an increased accuracy in detecting the deterioration of the semiconductor device can be achieved.

The presently disclosed embodiments are also expected to be combined and implemented as appropriate within a consistent range. The presently disclosed embodiments should be considered in all aspects as illustrative and not restrictive. The scope of the present invention is defined by the appended claims, rather than by the description above. All changes which come within the meaning and range of equivalency of the appended claims are to be embraced within their scope.

REFERENCE SIGNS LIST 1 to 4, 1A, 3A to 3C semiconductor device; 1a, 2a, 2b, 3a to 3g, 4a to 4k, 4m, 4n, 4p, 4q linear conductor; 10 semiconductor element; 11, 13 gate electrode; 21 collector electrode; 31 to 33, 33A, 33C emitter electrode; 41 to 44, 43A, 43C, 411 to 418, 421 to 428, 431 to 438, 441 to 448 bonding wire; 42A spring contact; 51 to 54 metal pattern; 70 insulating material; 80 base plate; 91, 92 conductive adhesive; 100, 400 controller; 101 gate controller; 102 voltage detector; 103, 403 deterioration determination unit; 104 information notification unit; 111, 112 negative supply; 113, 114 comparator; 115 AND circuit; 311, 312, 321 to 323, 331 to 338, 341 to 356 electrode pad; 405 current detector; 406 current sensor; and S1 spring.

The invention claimed is:

1. A semiconductor device including a first electrode, a second electrode, and a control electrode, the semiconductor device comprising:
 a controller configured to apply a voltage to the control electrode to control current flow from the first electrode to the second electrode;

a first metal pattern and a second metal pattern which are connected to the controller;

a connector connecting the first metal pattern and the second electrode; and a plurality of bonding wires connecting the second metal pattern and the second electrode, the second electrode including:

a plurality of electrode pads, including a first electrode pad and a second electrode pad; and a resistor connected between the first electrode pad and the second electrode pad, the plurality of bonding wires including:

a first bonding wire connecting the first electrode pad and the second metal pattern; and a second bonding wire connecting the second electrode pad and the second metal pattern, the controller being configured to detect deterioration of the semiconductor device when a potential difference between the first metal pattern and the second metal pattern is above a first threshold.

2. The semiconductor device according to claim 1, wherein
the resistor includes a linear electrode.

3. The semiconductor device according to claim 1, wherein
the controller is configured to apply the voltage to the control electrode using a potential of the first metal pattern as a reference potential.

4. The semiconductor device according to claim 1, wherein
the plurality of electrode pads are disposed regularly in plan view from a normal direction of a surface on which the second electrode is disposed.

5. The semiconductor device according to claim 1, wherein
the plurality of electrode pads are each connected to the second metal pattern by the plurality of bonding wires.

6. The semiconductor device according to claim 1, wherein
the connector includes a third bonding wire connecting the first metal pattern and the second electrode, and
the third bonding wire has a greater cross-sectional area than the plurality of bonding wires.

7. The semiconductor device according to claim 1, wherein
the connector includes an elastic body configured to give a bias to one end of the connector against the first electrode pad.

8. The semiconductor device according to claim 1, wherein
the connector includes:
a third bonding wire connecting the first electrode pad and the first metal pattern; and
a fourth bonding wire connecting the second electrode pad and the first metal pattern, wherein
the controller is configured to detect the deterioration of the semiconductor device when a current value flow through the first metal pattern is above a third threshold.

9. The semiconductor device according to claim 1, wherein
the controller is configured to:
notify of the deterioration of the semiconductor device when the potential difference is above the first threshold; and
stop the semiconductor device when the potential difference is above a second threshold greater than the first threshold.

10. The semiconductor device according to claim 8, wherein
the controller is configured to:
notify of the deterioration of the semiconductor device when the current value is above the third threshold; and
stop the semiconductor device when the current value is above a fourth threshold greater than the third threshold.

* * * * *